United States Patent
Teramoto et al.

(10) Patent No.: US 7,649,790 B2
(45) Date of Patent: Jan. 19, 2010

(54) SEMICONDUCTOR MEMORY DEVICE

(75) Inventors: Kazuhiro Teramoto, Tokyo (JP); Yoji Idei, Tokyo (JP); Takenori Sato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/170,561

(22) Filed: Jul. 10, 2008

(65) Prior Publication Data

US 2009/0016126 A1 Jan. 15, 2009

(30) Foreign Application Priority Data

Jul. 11, 2007 (JP) .............................. 2007-182360

(51) Int. Cl.
*G11C 29/00* (2006.01)
(52) U.S. Cl. ..................................... 365/201; 365/194
(58) Field of Classification Search ................. 365/201, 365/194, 189.09
See application file for complete search history.

(56) References Cited

U.S. PATENT DOCUMENTS

| | | | | |
|---|---|---|---|---|
| 6,501,693 | B2* | 12/2002 | Takatsuka et al. | 365/201 |
| 7,321,517 | B2* | 1/2008 | Ikeda et al. | 365/194 |
| 2007/0002648 | A1* | 1/2007 | Ikeda et al. | 365/201 |
| 2009/0040851 | A1* | 2/2009 | Mori et al. | 365/201 |

* cited by examiner

*Primary Examiner*—Anh Phung
(74) *Attorney, Agent, or Firm*—Young & Thompson (57) ABSTRACT

A semiconductor memory device is provided that is capable of detecting a short circuit defect to be detected in a memory array without causing an error due to off-current of a sense amplifier circuit. Sense amplifier circuits amplify a potential between a pair of bit lines, which occurs based on potential of memory cells selected by driving word lines and bit lines. Selection transistors are provided between the bit lines and the sense amplifier circuits. A word-SE interval control circuit included in an X timing generating circuit turns off the selection transistors and disconnects the bit lines from the sense amplifier circuits based on a signal representing a test state for expanded time when a test to expand an interval between word line driving and activation of the sense amplifier circuits and detect defect sites of the bit lines is performed.

3 Claims, 12 Drawing Sheets

PRIOR ART

US 7,649,790 B2

SEMICONDUCTOR MEMORY DEVICE

BACKGROUND OF THE INVENTION

1. Field of the Invention

The present invention relates to a semiconductor memory device which enables a test of defect sites in dynamic random access memory, for example Priority is claimed on Japanese Patent Application No. 2007-182360, filed Jul. 11, 2007, the content of which is incorporated herein by reference.

2. Description of Related Art

A memory array of dynamic random access memories (DPAMs) is configured by bit lines and word lines. Data is stored in memory cells arranged at intersections of the bit lines and the word lines. By detecting a minute potential difference which occurs on a pair of bit lines, the data is detected from the memory array. The minute potential difference occurring on the pair of bit lines is amplified and output by a sense amplifier circuit included in the DRAM.

With the recent advance of miniaturization technologies, gaps between wirings in a memory array become narrower and narrower. Due to this, defects appear such as short circuit between word lines and bit lines. One method of detecting and rejecting such short circuit defects is a test mode to expand generation intervals of word line driving sense amplifier circuit activation signals SE (hereinafter referred to as "word-SE interval expansion test"). In this test mode, the generation intervals of word line driving and sense amplifier circuit activation signals SE are expanded from several ns in normal operation up to several μs.

Figure 11:
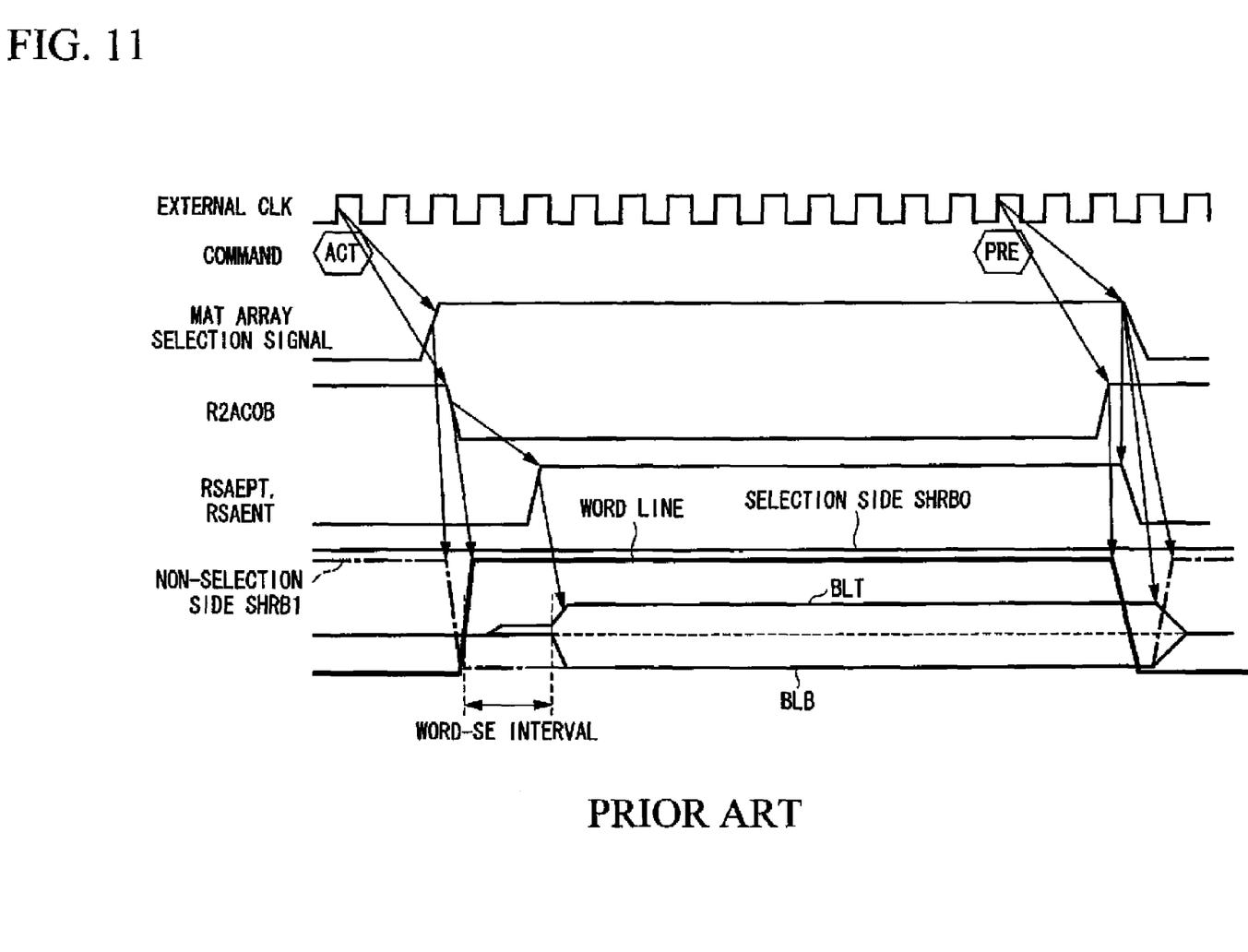
FIG. 11 is a timing chart showing a normal operation in the related art and the embodiment.

The word-SE interval expansion test mode will be now described with reference to FIGS. 11 and 12. FIG. 11 is a timing chart showing an operation in a normal state, where the word-SE interval expansion test is not performed. A control signal R2AC0B determines a timing at which a word line is driven. Control signals RSAEPT and RSAENT correspond to the above-mentioned sense amplifier circuit activation signal SE and cause a sense amplifier circuit to initiate an amplification operation. When an active command ACT is input, a mat array selection signal is input by an address input along with the active command and accordingly a targeted memory mat is selected. When the control signal R2AC0B is input, that is, when the control signal R2AC0B is changed from an "H (High)" state to an "L (Low)" state, the word line is driven. As described above, in the operation in the normal state, the sense amplifier circuit is activated after the lapse of several ns during which the word line is driven. Due to this, the control signals RSAEPT and RSAENT are generated by delaying the control signal R2AC0B by means of a delay element or the like, thereby activating the sense amplifier circuit.

Figure 12:
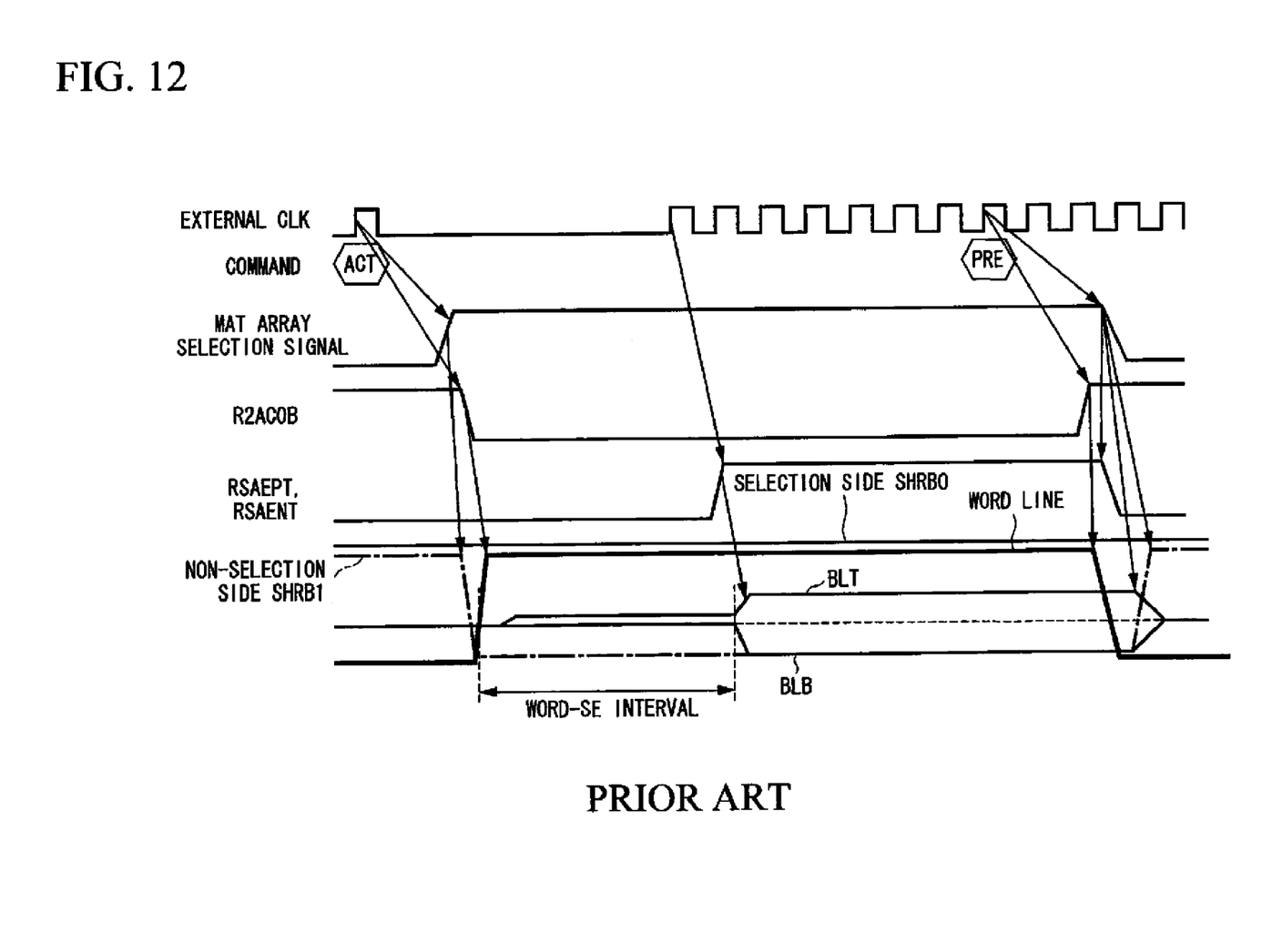
FIG. 12 is a timing chart showing an operation in a word-SE interval expansion test in the related art.

FIG. 12 is a timing chart showing an operation in a case of word-SE interval expansion test mode. In the case of word-SE interval expansion test mode, a generation interval of an external CLK is expanded to several μs by means of a tester or the like. This delays generation of the control signals RASEPT and RSAENT to activate the sense amplifier circuit, thereby achieving the word-SE interval expansion test. Thus, as shown in FIG. 12, it can be seen that an interval between word line driving and generation of the sense amplifier circuit activation signal is further expanded as compared to FIG 11.

As the word-SE interval is expanded, a bit line detected as having a short circuit defect loses the amount of signal output from a memory cell due to leakage through the short circuited site. Therefore, when the sense amplifier circuit is activated, it is possible to detect the site having the short circuit defect and thus to reject the defect site.

In recent years, with an increase in the speed of DRAMs, due to reducing power consumption, voltage of a power unit has been lowered, such as single data rate (SDR) (3.3 V), double data rate (DDR) (2.5 V), DDR2 (1.8 V), DDR3 (1.5 V) and so on. With such lowering of voltage, the voltage of a memory cell array (hereinafter referred to as "Vary") has also been lowered. The lowering of the Vary lowers the voltage of a gate with respect to a source of a transistor of a sense amplifier circuit in a sensing operation (hereinafter referred to as "Vgs"). This becomes the cause of a decrease in a sensing speed. If a threshold voltage of the transistor of the sense amplifier circuit is lowered in order to prevent such decrease in the sensing speed, it is known that off-current of the sense amplifier circuit is increased.

In the above-described word-SE interval expansion test, the transistor of the sense amplifier circuit is in a turn-off state for a long time after normal operation starts.

If the threshold voltage is lowered in order to prevent a decrease in the sensing speed, increased off-current flows for the expanded time. In this state, when the short circuit defect is to be detected in the word-SE interval expansion test, read data is lost due to the off-current of the transistor of the sense amplifier circuit. That is, there arises a problem that a site in which data is lost due to the off-current is also detected in addition to the short circuit defect to be originally detected.

SUMMARY

The present invention seeks to solve one or more of the above problems, or to improve those problems at least in part.

The present invention provides a semiconductor memory device which is capable of detection a short circuit defect originally detected in a memory array without causing a defect due to the off-current of a sense amplifier circuit when performing a generation interval expansion test of a word line driving sense amplifier circuit activation signal.

In one embodiment, there is provided a semiconductor memory device that comprises: memory cells which are connected to each of plural pairs of bit lines when one of word lines associated with each of the memory cells is driven; sense amplifier circuits that amplify a potential difference between each of the plural pairs of bit lines; switch portions which are interposed between each of the memory cells and the sense amplifier circuits on each of the plural pairs of bit lines; a test control circuit that generates a first control signal based on a word line driving timing signal for driving the word lines and a clock signal whose clock generation interval is arbitrarily expanded, so as to supply the first control signal during the expanded interval; and a control circuit that generates, based on the first control signal, a switch control signal to turn off one of the switch portions corresponding to one of the plural pairs of bit lines selected by a selection signal, and supplies the switch control signal to one of the switch portions.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated here for explanatory purposes.

Figure 1:
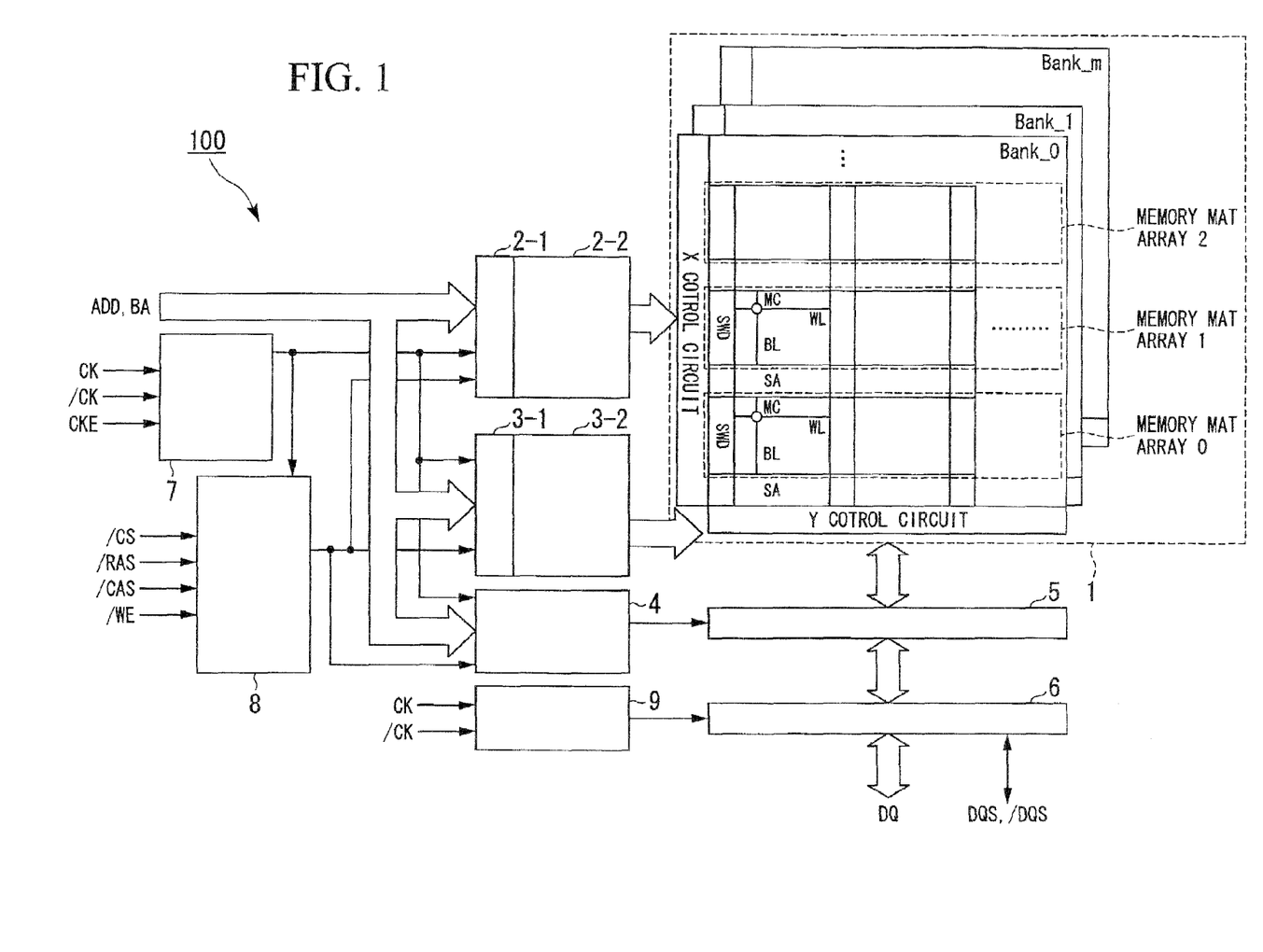
FIG. 1 is a block diagram showing a semiconductor memory device according to an embodiment.

FIG. 1 is a block diagram showing a whole configuration of a semiconductor memory device 100 according to an embodiment.

The semiconductor memory device 100 includes a memory array 1, an X decoder 2-1, an X timing generating circuit 2-2, a Y decoder 3-1, a Y timing generating circuit 3-2, a data control circuit 4, a data latch circuit 5, an input/output interface 6, an internal clock (CLK) generating circuit 7, a control signal generating circuit 8 and a delay locked loop (DLL) circuit 9.

The memory array 1 includes a plurality of banks Bank_0, ..., Bank_m. Each bank includes a plurality of memory mat arrays (memory mat array 0, memory mat array 1, memory mat array 2, ...). Each memory mat array includes a plurality of memory mats having a plurality of word lines WL and a plurality of bit lines BL, a sense amplifier circuit SA, and a sub word driver circuit SWD. A memory cell MC is located at an intersection of each word line and each bit line.

The memory array 1, the data latch circuit 5 and the input/output interface 6 are interconnected by a data transfer bus. The data control circuit 4 controls data transfer in the data latch circuit 5. The DLL circuit 9 is input with clocks CK and /CK and controls a timing of output of data in the input/output interface 6 to the outside. The X decoder 2-1, the X timing generating circuit 2-2, the Y decoder 3-1 and the Y timing generating circuit 3-2 control writing/reading of data into/from a memory cell in the memory array 1. The internal CLK generating circuit 7 is input with CK, /CK and Clock Enable (CKE) and generates clock signals to be used in the control signal generating circuit 8, the X decoder 2-1, the Y decoder 3-1 and the data control circuit 4. The control signal generating circuit 8 generates and outputs signals to control the X decoder 2-1, the X timing generating circuit 2-2, the Y decoder 3-1 and the Y timing generating circuit 3-2 based on input Chip Select (/CS), Row Address Strobe (/RAS), Column Address Strobe (/CAS) and Write Enable (/WE). Here, the symbol "/" represents that a low level becomes an active level.

Figure 2:
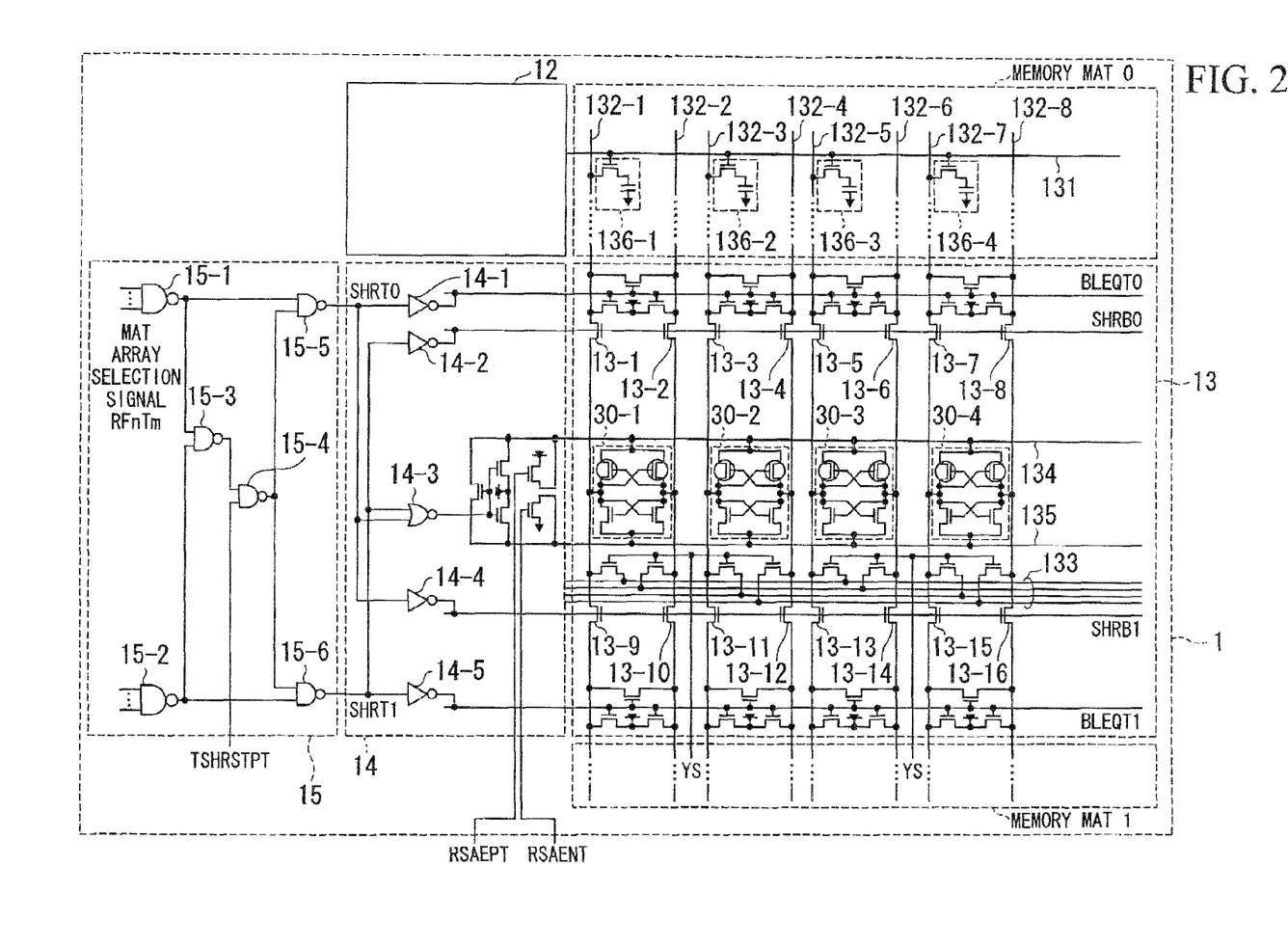
FIG. 2 is a circuit diagram of a memory array according to the embodiment.

FIG. 2 is a circuit diagram of the memory mat 0 and the memory mat 1, which are included in each of two memory mat arrays of the memory array of FIG. 1, a SA circuit block 13, which is interposed between these memory mats 0 and 1, a sub word driver circuit 12 corresponding to the memory mat 0, a SA control circuit 14 and an X control circuit 15. In addition, although not shown, a sub word driver circuit corresponding to the memory mat 1 is present similarly to the sub word driver circuit 12 corresponding to the memory mat 0.

Each of the memory mat 0 and the memory mat 1 has a plurality of word lines 131 and a plurality of bit lines 132-1 to 132-8 (hereinafter generally referred to as "bit line 132"). In addition, although only one word line is shown in FIG. 2, a plurality of word lines are presented, and one or all of word lines are hereinafter represented by a word line 131.

Memory cells 136-1 to 136-4 to store data are respectively located at intersections of the word line 131 and the bit lines 132. The memory cells 136-1 to 136-4 are each configured by a capacitor to store data and a transistor for selection. A gate of the transistor is connected to the word line, one of a drain and a source of the transistor is connected to the bit line 132, and the other is connected to the capacitor.

The sub word driver circuit 12 drives or selects the word line 131 in order to turn on transistors of the memory mats 0 and 1. Although not shown, a mat array selection signal input to the X control signal 15, which will be described later, is also input to the sub word driver circuit 12. The sub word driver circuit 12 drives the word line 131 of the selected memory mat 0 based on the mat array selection signal.

The SA circuit block 13 has sense amplifier circuits 30-1 to 30-4 (hereinafter, one or all of sense amplifier circuits being represented by sense amplifier circuit 30). The sense amplifier circuit 30 is an amplification circuit configured by a PMOS transistor and an NMOS transistor. The sense amplifier circuit 30 amplifies data read from a data storage capacitor into the bit line via the transistors of the memory mats 0 and 1, that is, a minute potential difference between a pair of bit lines connected to the sense amplifier circuit 30.

As shown in FIG. 2, the sense amplifier circuit 30 of the SA circuit block 13 is arranged between the memory mat 0 and the memory mat 1. The sense amplifier circuit 30 is a shared type sense amplifier which is shared by the two memory mats 0 and 1 and is selectively used between the memory mat 0 and the memory mat 1. Selection transistors 13-1 to 13-16 are provided in connections between the memory cells memory mat side of a pair of bit lines and the sense amplifier circuit 30 side of the pair of bit lines. Control signals SHRB0 and SHRB1 generated by the SA control circuit 14, which will be described later, control turning-on/off of the selection transistors 13-1 to 13-16.

In the SA circuit block 13, an I/O line 133 transmits the data amplified by SA to the outside of the memory array 1. A Y switch (YS) controls data transmission in the I/O line 133 based on a YS signal input from the Y control circuit shown in FIG. 1. The YS is configured by an N-MOS transistor connected to the I/O line 133, the bit line 132 and a control line input with the YS signal. A pre-charge circuit is configured with three N-MOS transistors connected to the bit line 132, a control line input with control signals BLEQT0 and BLEQT1, which will be described later, and a power supply. The pre-charge circuit is controlled by the control signals BLEQT0 and BLFQT1 and performs a pre-charge operation when the bit line is in a non-selection state.

The SA control circuit 14 is connected to the SA circuit block 13 and the X control circuit 15. The SA control circuit 14 generates and outputs the control signals SHRB0 and SHRB1 to control the selection transistors 13-1 to 13-16 based on control signals SHRT0 and SHRT1 input from the X control circuit 15. The SA control circuit 14 generates and outputs the control signals BLEQT0 and BLEQT1 to control the pre-charge circuit in non-selection based on the control signals SHRT0 and SHRT1.

The X control circuit 15 is input with the mat array selection signal from the X timing generating circuit 2-2 of FIG. 2. The X control circuit 15 decodes the input mat array selection signal, generates the control signals SHRT0 and SHRT1 to control the SA control circuit 14, and inputs these generated control signals to the SA control circuit 14. A control signal TSHRSTPT input to the X control circuit 15 is a control signal to control generation and output of the control signals SHRT0 and SHRT1 in order to expand a word-SE interval in a test mode to expand a generation interval of a word line driving sense amplifier circuit activation signal (hereinafter referred to as "word-SE interval).

Figure 3:
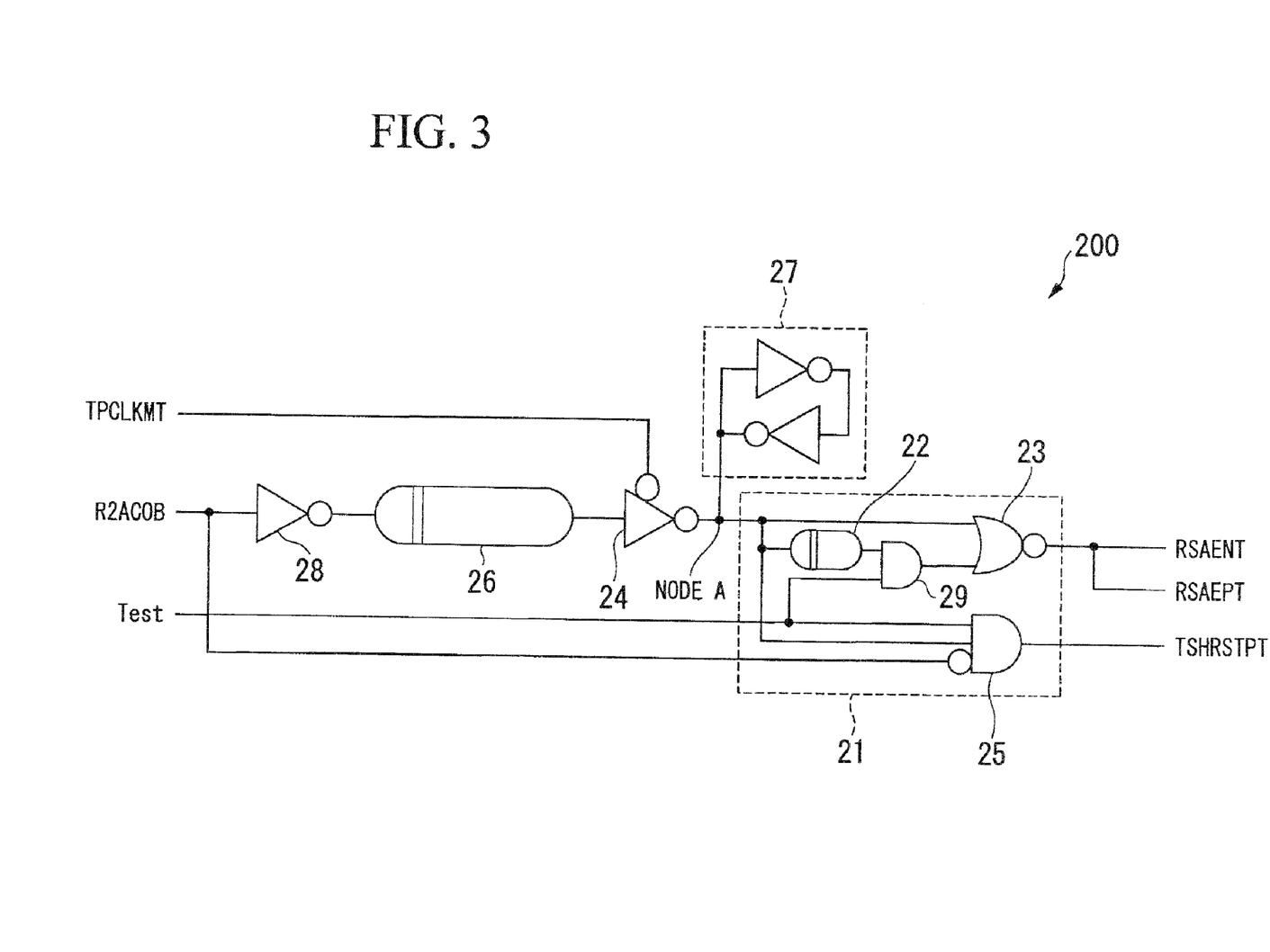
FIG. 3 is a circuit diagram of a word-SE interval control circuit according to the embodiment.

FIG. 3 is a circuit diagram of a word-SE interval control circuit 200 according to the embodiment. The word-SE interval control circuit 200 is in the X timing generating circuit 2-2 of FIG. 1 and performs control of the control signal TSHRSTPT input to the X control circuit 15 and control signals RSAENT and RSAEPT input to the SA control circuit 14. Here, the control signals RSAENT and RSAEPT are control signals to activate the sense amplifier circuit 30. In addition, the control signal TSHRSTPT controls generation of the control signals SHRT0 and SHRT1 by the X control circuit 15, as described above, and finally controls generation of the control signal SHRB0 and SHRB1 to control turning-on/off of the selection transistors 13-1 to 13-6.

The word-SE interval control circuit 200 has an inverter 28, a delay element 26, a clocked inverter 24, a flip-flop circuit 27 and a composite gate element 21. In the word-SE interval control circuit 200, a control signal R2AC0B is a signal to determine a driving timing of the word line and remains in an "H" state when all memory mats are in a non-selection state. A control signal Test is a test mode initiation signal representing initiation of a test mode to expand a "word-SE interval" and becomes an "H" state during the test mode. A control signal TPCLKMT is a control signal of the clocked inverter 24, which will be described later, and is a signal representing initiation of the test mode to expand the "word-SE interval". The control signal TPCLKMT is in an "L" state when the test mode is not used, and switches the state to "H" and "L" states, which are opposite with respect to an external CLK, in synchronization with the external CLK when the test mode to expand the "word-SE interval" is initiated.

Here, the external CLK is a clock input from the internal CLK generating circuit 7 of FIG. 1 to the X timing generating circuit 2-2 and is a clock generated by the internal CLK generating circuit 7 based on CK and /CK.

The delay element 26 is a delay element to determine the "word-SE interval" and generates a delay of several ns or so. The flip-flop circuit 27 maintains a potential of a node A when the clocked inverter 24 is in an off state. The clocked inverter 24 is input with the above-mentioned control signal TPCLKMT, transmits a state of the control signal R2AC0B to a subsequent stage by interconnecting an input and an output when the control signal TPCLKMT is in an "L" state, for example, and stops the transmission of the state of the control signal R2AC0B by disconnecting the input and the output when the control signal TPCLKMT is in an "H" state. In addition, when the input and the output of the clocked inverter 24 are disconnected, the state of the control signals RSAEPT and RSAENT at the subsequent stage is held by the flip-flop circuit 27.

The composite gate element 21 has a delay element 22, a NOR element 23, an AND element 29 and an AND element 25. The delay element 22 determines a delay time until the sense amplifier circuit 30 is activated after read data is input to the sense amplifier circuit 30 as the control signal TSHRSTPT goes to an "L" state. The AND element 25 has two positive logic terminals to which the control signal Test and an output signal of the clocked inverter 24 are input, and one negative logic terminal to which the control signal R2AC0B is input. The composite gate element 21 performs substantially the same operation as the inverter having a state of the node A as the input if the control signal TSHRSTPT as an output of the AND element 25 remains in an "L" state and an output of the AND element 29 also remains in an "L" state when the control signal Test is in an "L" state, that is, when the mode is not the test mode.

Figure 4A:
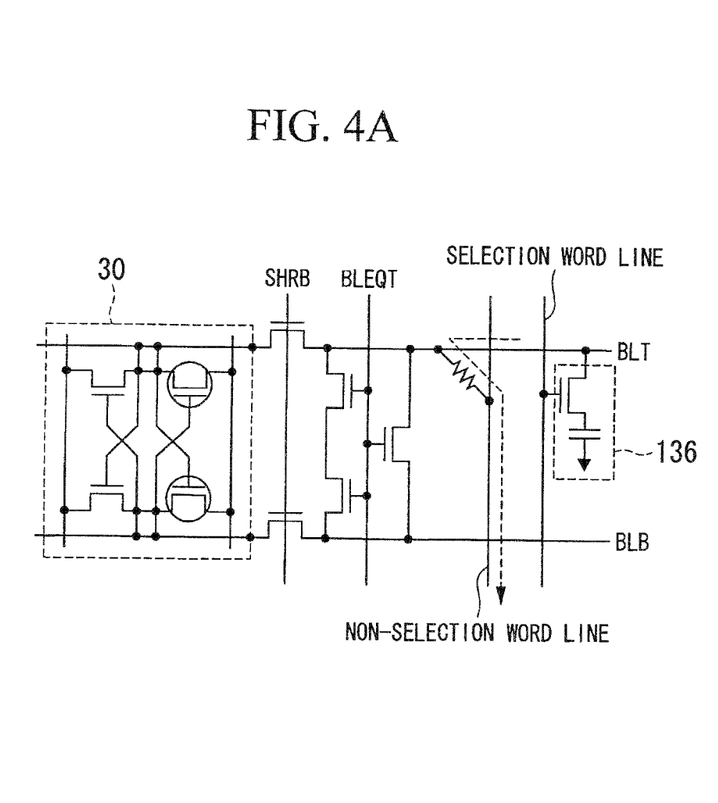
FIG. 4A is a circuit diagram showing generation of short circuit according to the embodiment.
Figure 4B:
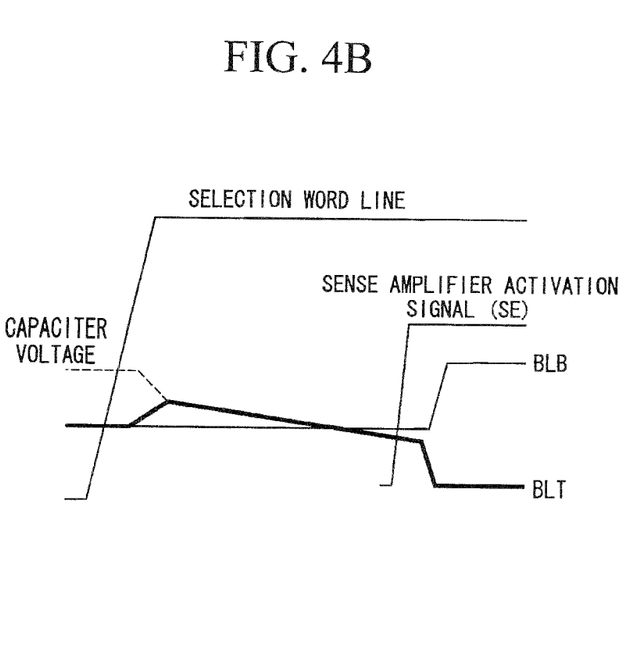
FIG. 4B is a diagram showing an operation waveform in the circuit configuration shown in FIG. 4A.

Next, a defect site due to a short circuit between a bit line to be detected in the embodiment and a non-selection word line will be described with reference to FIGS. 4A and 4B. FIG. 4A shows circuit configuration when a bit line BLT and a non-selection word line in a memory mat are short circuited. FIG. 4B shows an operation waveform in this circuit configuration. As shown in FIG. 4A, when a selection word line is driven to read out data, data corresponding to a "1" is output from a data storage capacitor in a memory cell 136 to the bit line BLT. Thereby, the potential of the bit line BLT rises by $\Delta V$ over a pre-charge level. At this time, if the bit line BLT and the non-selection word line are short circuited, charges are introduced into the non-selection word line via the short circuit defect site. For this reason, as shown in FIG. 4B, the potential of the bit line BLT becomes lower than the potential of a bit line BLB. In this state, when the SA activation signal SE is input and thus the sense amplifier circuit 30 is activated, the potential of the bit line BLT becomes lower than the pre-charge level. In other words, the potential of the bit line BLB is amplified to a state higher than the potential of the bit line BLT. This makes it possible to detect an erroneous sense.

Figure 5A:
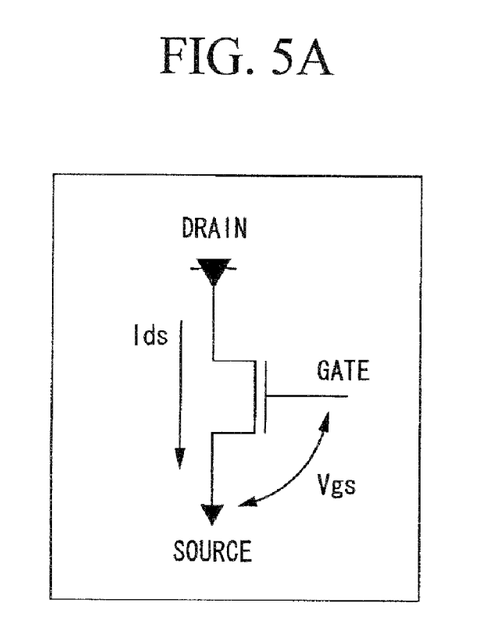
FIG. 5A is a circuit diagram showing off-current according to the embodiment.
Figure 5B:
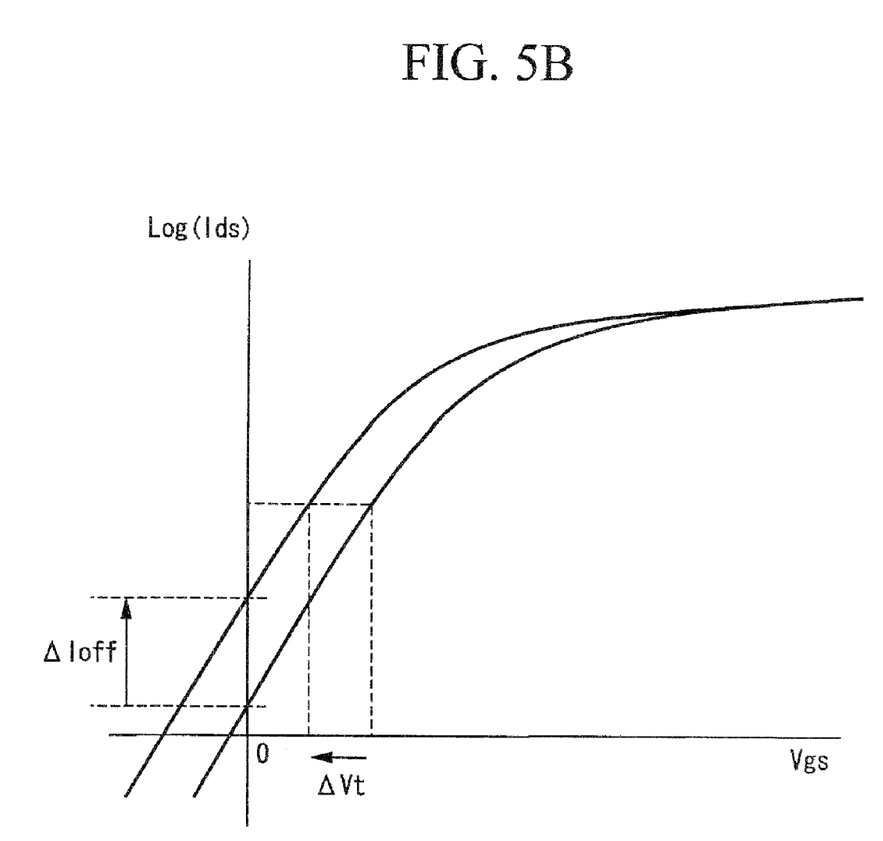
FIG. 5B is a graph showing an Ids-Vgs characteristic of an N-MOS transistor shown in FIG. 5A, where the Vgs is voltage of a gate with respect to a source and the Ids is a current flowing from a drain to the source.

Next, a relationship between off-current Ioff generated in an off state of the sense amplifier circuit 30 and a threshold voltage will be described with reference to FIGS. 5A and 5B. A graph of FIG. 5B shows an Ids-Vgs characteristic of an N-MOS transistor shown in FIG. 5A. In the N-MOS transistor, when a voltage Vgs of a gate with respect to a source is increased, current Ids flows from a drain to the source. In general, a threshold voltage Vt of the N-MOS transistor is defined by a value of the voltage Vgs when the predetermined amount of the current Ids flows. Since the current Ids obtainable with the same voltage Vgs is increased when the threshold voltage Vt is lowered, the performance of the N-MOS transistor is improved and the transfer speed is increased. On the other hand, the off-current Ioff of the N-MOS transistor is defined by the current Ids when Vgs=0 V. That is, as shown in FIG. 5B, when the threshold voltage Vt is lowered, the off-current is increased. Although FIGS. 5A and 5B show the relationship between the off-current and the threshold voltage using the N-MOS transistor, the same relationship is true of a P-MOS transistor.

Figure 6:
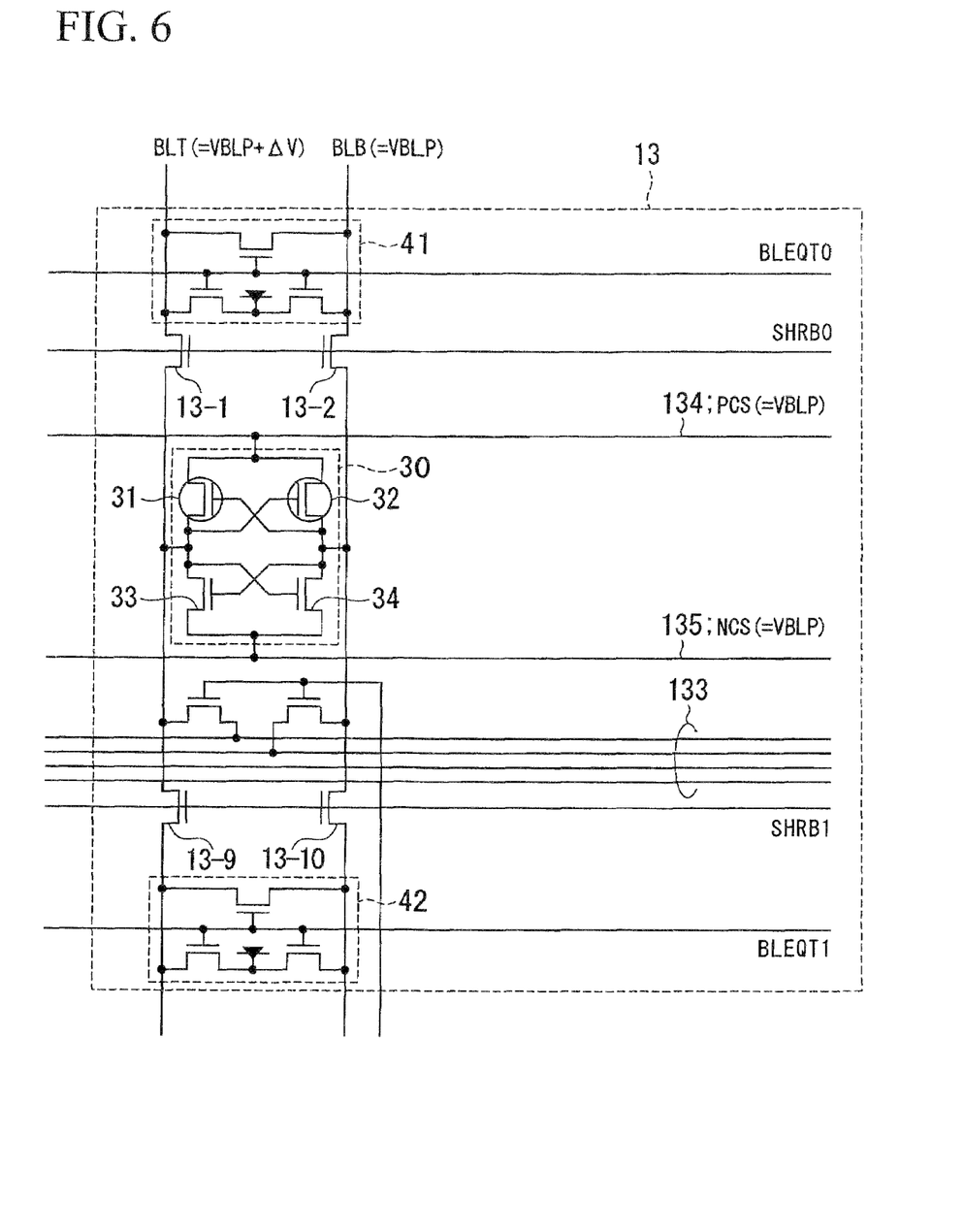
FIG. 6 is a circuit diagram showing an effect of off-current according to the embodiment.

Next, an effect of the above-described sense amplifier circuit 30 by the off-current Loff will be described with reference to FIG. 6. FIG. 6 is a partially-enlarged view of the SA circuit block 13 of FIG. 2. The sense amplifier circuit 30 is pre-charged to a VBLP potential by pre-charge circuits 41 and 42 when the circuit 30 is inactivated. At this time, the bit lines BLT and BLB and a PCS line 134 and an NCS line 135, which are respectively connected to sources of P-MOS transistors 31 and 32 and N-MOS transistors 33 and 34 in the sense amplifier circuit 30, are all set to the VBLP potential. Before the word line is driven, transistors in the pre-charge circuits 41 and 42 are turned off. When the word line is selected, a minute potential difference occurs between the bit line BLT and the bit line BLB by capacitive coupling between the data storage capacitor and the bit lines. This state is maintained during the word-SE interval.

FIG. 6 shows a state where the data storage capacitor at the bit line BLT side is connected and the data is output (data=1). As a result of capacitive coupling, the potential of the bit line BLT is maintained at a voltage higher by a minute potential $\Delta V$ than the VBLP potential. At this time, in the N-MOS transistor 33 of the sense amplifier circuit 30, both potentials of the gate and source are the VBLP potential and Vgs=0 V. Since the drain potential is VBLP+$\Delta V$, the off-current shown in FIG. 5 flows from the drain connected to the bit line BLT to the source, thereby beginning to flow through the NCS line 135. For the P-MOS transistor 31, since the gate potential is the VBLP potential and is lower by $\Delta V$ than a potential of the source connected to the PCS line 134, the P-MOS transistor 31 is turned on only when Vgs=$\Delta V$. Accordingly, by the P-MOS transistor 31, a current slightly larger than the off-current begins to flow from the bit line BLT to the PCS line.

If the threshold voltage of a transistor is high, the current Ids becomes small. Although the word-SE interval is several µs, the effect on the current Ids is slight. However, in a case where the memory array has a low voltage, since a sensing speed is lowered if the voltage Vgs becomes small when the sense amplifier circuit 30 is activated, the threshold voltage Vt is lowered in order to secure the sensing speed. In the memory array 1 of this embodiment, since the threshold voltage Vt is in a lowered state, the off-current of the transistors of the sense amplifier circuit 30 is increased. When the test mode to expand the word-SE interval is used, read data is lost due to the off-current.

Figure 7A:
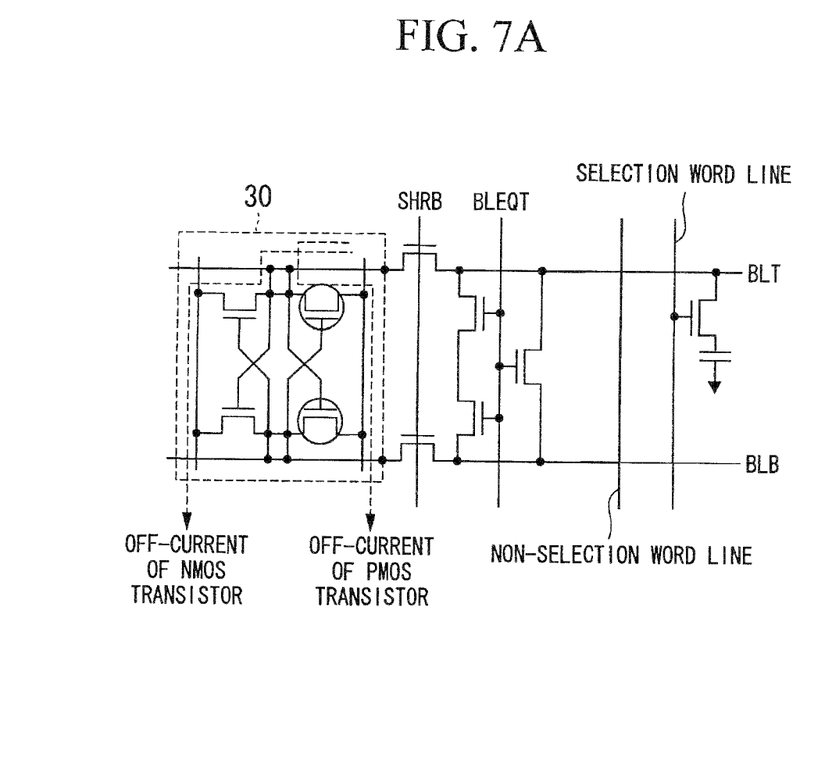
FIG. 7A is a circuit diagram showing data loss by off-current according to the embodiment.
Figure 7B:
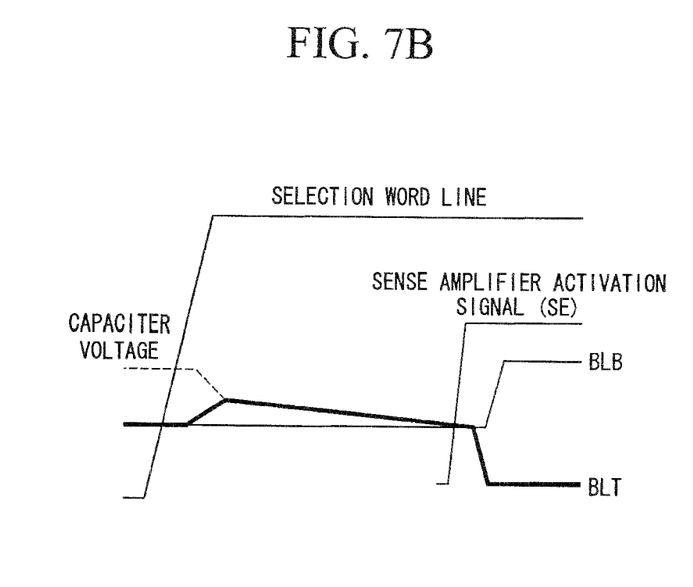
FIG. 7B is a graph showing an operation waveform in the circuit configuration shown in FIG. 7A.

FIGS. 7A and 7B show a circuit configuration and an operation waveform in a state where read data is lost due to the off-current of the transistors of the sense amplifier circuit 30. As shown in FIG. 7A, there exists no short circuit defect between the bit line and the word line as shown in FIG. 4A. However, since the off-current of the transistors of the sense amplifier circuit 30 is large, charges read from the bit line BLT are discharged through the transistors of the sense amplifier circuit 30 by the word-SE interval expansion test. In this state, when the SA activation signal SE is input and the sense amplifier circuit 30 is activated, an erroneous sense is made since there is no sufficient potential difference in the bit lines BLT and BLB. A site having no problems when the word-SE interval is several ns may be detected as a defect site such as a short circuit defect site.

(Operation in Normal Operation Mode)

Next, an operation of the semiconductor memory device in this embodiment shown in FIGS. 1 to 3 will be described. First, an operation in a normal operation mode will be described. The normal operation mode has the same operation waveforms as the timing chart shown in FIG. 11, and therefore description will be given with reference to FIG. 11.

In the normal operation mode, since the control signal Test in FIG. 3 is in an "L" state, the control signal TSHRSTPT remains in an "L" state. Therefore, since an output of the NAND element 15-4 in the X control circuit 15 remains in an "H" state, the NAND elements 15-5 and 15-6 perform substantially the same operation as the inverter. In this state, when an active command ACT is input, the word line is selected by an address input at the same time of input of the active command. For example, when an address to select the word line in the memory mat 0 in FIG. 2 is input, a mat array selection signal RFnTm to select the memory mat 0 is input as "H" to the NAND element 15-1. By the input of this mat array selection signal, the control signal SHRT0 being in an "H" state is output from the NAND element 15-5. In addition, since the control signal SHRT1 output from the NAND element 15-6 remains in an "L" state, the memory mat 1 remains in a non-selection state.

As the control signal SHRT0 is in the "H" state, the bit line pre-charge signal BLEQT0 being in an "L" state is output from the inverter 14-1 of the SA control circuit 14 and pre-charge of the bit line at the selected memory mat 0 side is released. On the other hand, since the control signal SHRT1 remains in the "L" state, the control signal SHRB0 as an output of the inverter 14-2 of the SA control circuit 14 remains in an "H" state. Thus, by the selection transistor 13-1 to 13-8, the memory mat 0 and the sense amplifier circuit 30 remain in a connection state.

In addition, as the control signal SHRT0 is output as "H", the control signal SHRB1 output from the inverter 14-4 becomes "L" and the memory mat 1 at a non-selection side is disconnected from the sense amplifier circuit block 13. By this operation, the sense amplifier circuit 30 of the sense amplifier circuit block 13 is able to amplify data of the memory mat 0 at a selection side.

After completion of the above series of operations in the sense amplifier circuit block 13, one word line 131 in the memory mat 0 at the selection side is selected by the sub word driver circuit 12. The data is read from the data storage capacitor into each of the bit lines 132-1 to 132-8 through the transistor connected to the selected word line 131. In this data reading operation, since the data storage capacitor is capacitively coupled with a parasitic capacitance of each of the bit lines 132-1 to 132-8, a minute potential difference is produced between two bit lines, for example, the bit line 132-1 and the bit line 132-2, and is amplified by the sense amplifier circuit 30.

Because of wiring resistance of the bit lines, it takes time to transfer data from the data storage capacitor to the sense amplifier circuit 30. Due to this, a predetermined wait time, which is called the above "word-SE interval," is required until the sense amplifier circuit 30 is activated after the word line is driven. Control of this predetermined wait time is performed by the word-SE interval control circuit 200 shown in FIG. 3.

As described above, in the normal operation mode, since the control signal Test in FIG. 3 remains in an "L" state, the composite gate element 21 performs substantially the same operation as the inverter. In the normal operation mode, since the control signal TPCLKMT also remains in an "L" state, the clocked inverter 24 is in an input/output connection state. When the control signal R2AC0B becomes "L", it is inverted by means of the inverter 28, delayed by the predetermined wait time, which is the above described "word-SE interval," by means of the delay element 26, and then input to the clocked inverter 24. Since the clocked inverter 24 remains in a connection state, it determines and outputs an input state. Since the control signal R2AC0B is "L", the output becomes "L". Since the composite gate element 21 performs substantially the same operation as the inverter, when "L" is input from the clocked inverter 24, the control signals RSAENT and RSAEPT to activate the sense amplifier circuit 30 become "H". When the control signals RSAENT and RSAEPT being in an "H" state are input, the sense amplifier circuit 30 is activated to amplify a minute potential difference between bit lines, for example, the bit line 132-1 and the bit line 132-2.

As shown in FIG. 11, when a pre-charge command PRE is input after the lapse of a certain amount of time, all of the mat array selection signals become "L" and thus the control signals SHRT0 and SHRT1 become "L". Thereby, both of the control signals SHRB0 and SHRB1 become "H" so that the selection transistors 13-1 to 13-16 are turned on, and thus the sense amplifier circuit 30 is connected to the bit lines of both memory mats 0 and 1. The control signal R2AC0B becomes "H". Thereby, the control signals RSAEPT and RSAENT become "L" and thus the sense amplifier circuit 30 becomes an inactivation state. Since the control signals SHRT0 and SHRT1 are "L", the control signals BLEQT0 and BLEQT1 become "H" and thus a pair of bit lines is pre-charged by the pre-charge circuit.

(Operation in Word-SE Interval Expansion Test Mode)

Next, an operation in the word-SE interval expansion test mode will be described with reference to FIG. 8. As described above, if there exists a short circuit defect of a bit line in a memory mat, the sense amplifier circuit 30 makes an erroneous sense, since charges of the bit line are lost through resistance of a short circuit site. However, if short circuit resistance is very high, current is too small to be detected in the word-SE interval of several ns or so as described above. The "word-SE interval expansion test mode" is used as means for detecting such a high resistance short circuit defect. This test mode expands the word-SE interval of several ns to several µs, thereby making it possible to detect the high resistance short circuit.

When the "word-SE interval expansion test mode" is initiated, the control signal TPCLKMT input to the word-SE interval control circuit 200 of FIG. 3 becomes "H". The control signal Test also becomes "H". At this time, since the clocked inverter 24 disconnects an input and an output, a state of the control signal R2AC0B, which becomes "L" after an active command is input, is not transmitted to the node A. For this reason, the node A remains in an "H" state by an operation of the flip-flop circuit 27. When the node A remains in the "H" state, the control signals RSAENT and RSAEPT remain in an "L" state. The sense amplifier circuit 30 becomes an inactivation state, i.e., an off state. At this time, since the control signal Test becomes "H", the node A becomes "H" and the control signal R2AC0B is in the "L" state, an input of the AND element 25 of the composite gate element 21 is inverted to an "H" state by a negative logic and accordingly the output control signal TSHRSTPT transitions to an "H" state.

When the control signal TSHRSTPT transitions to the "H" state, an output of the NAND element 15-4 of the X control circuit 15 of FIG. 2 operates according to an output of the NAND element 15-3. For example, when the memory mat 0 of FIG. 2 is selected, the output of the NAND element 15-1 becomes "L". Since one input of the NAND element 15-3 becomes "L", the output of the NAND element 15-3, that is, one input of the NAND element 15-4 becomes "H". At this time, since both inputs of the NAND element 15-4 become "H", the output becomes "L". Since one input of each of the NAND elements 15-5 and 15-6 is input with an "L" state, both of the output control signals SHRT0 and SHRT1 become "H". Therefore, as shown in FIG. 8, both of the control signals SHRB0 and SHRB1 also become "L". Thereby, the selection transistors 13-1 to 13-16 are all turned off and the memory mat 0 and the memory mat 1 are disconnected from the sense amplifier circuit 30.

At this time, since the memory mat 0 remains in a selection state, the word line 131 is selected by the sub word driver circuit 12 and the data is read into the bit lines 132-1 to 132-8. However, since the memory mat 0 is disconnected from the sense amplifier circuit 30, the data is not input to the sense amplifier circuit 30. At this time, read data is always maintained on the bit lines 132-1 to 132-8 of the memory mat 0. If there exists a short circuit defect in a bit line, the read data is lost through a short circuit site. On the other hand, since the sense amplifier circuit 30 is disconnected from the bit lines 132-1 to 132-8, the data is not lost without charges on the bit lines flowing through the PCS line 134 and the NCS line 135 by off-current of the sense amplifier circuit 30.

It is possible to expand the "word-SE interval" by maintaining the external CLK in an "L" state for several µs after inputting the active command ACT. Thereafter, when the external CLK transitions to an "H" state, the control signal TPCLKMT, which is changed in phase reverse to the external CLK, follows the external CLK to become "L". When the control signal TPCLKMT becomes "L", the clocked inverter 24 becomes an input/output opened state and an "L" state of the control signal R2AC0B is transmitted to a subsequent stage. Thereby, the node A becomes "L" and the control signal TSHRSTPT becomes "L". Since the output of the NAND element 15-4 of the X control circuit 15 becomes "H", the test mode performs the same operation as the above-described normal operation mode. At this time, the memory mat 1 is in a non-selection state. Since the output of the NAND element 15-2 remains in the "H" state, the control signal SHRT1 becomes "L". Since the control signal SHRB0 becomes "H", the selection transistors 13-1 to 13-8 are turned on. On the other hand, since the control signal SHRT0 remains in the "H" state, the control signal SHRB1 also remains in the "L" state.

There occurs a delay time due to wiring parasitic capacitance of the bit lines 132-1 to 132-8 until the read data reaches the sense amplifier circuit 30 after the control signal TSHRSTPT transitions to the "L" state. A delay by this delay time is defined by the delay element 22 of the composite gate element 21. After lapse of predetermined time after the control signal TSHRSTPT transitions to the "L" state, the control signals RSAENT and RSAEPT become "H". Since the sense amplifier circuit 30 is turned on, potentials of the bit lines BLT and BLB are amplified. "α" in FIG. 8 represents a potential rise which occurs when the bit lines BLT and BLB are connected to the sense amplifier circuit 30 as the control signal SHRB0 becomes "H".

Figure 8:
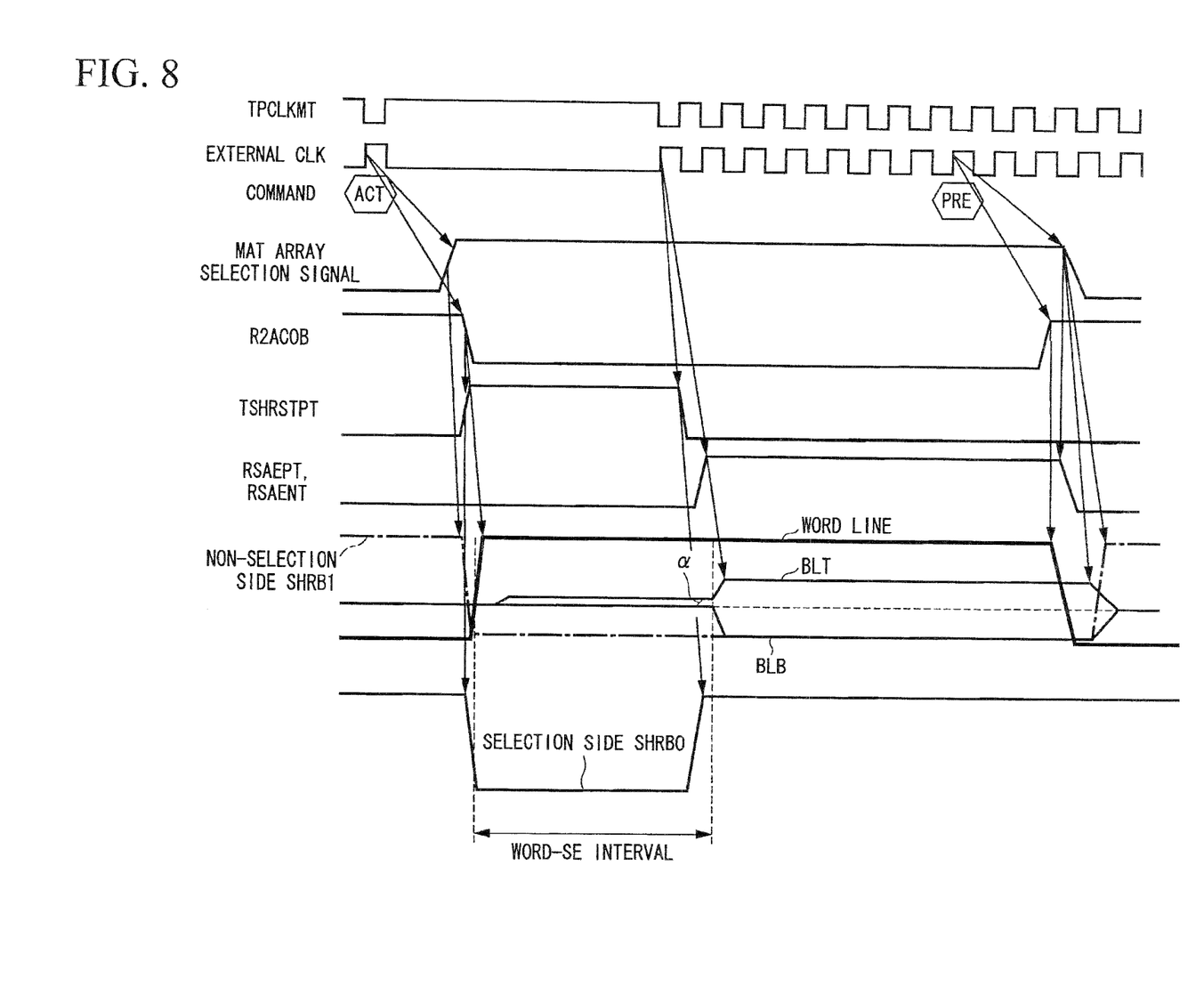
FIG. 8 is a timing chart showing an operation of a word-SE interval expansion test according to the embodiment.

As shown in FIG. 8, by this delay element 22, after the "word-SE interval" is completed, the control signal SHRB0 at the selection side can become "H", the data on the bit lines 132-1 to 132-8 can be input to the sense amplifier circuit 30, and after the lapse of a predetermined time, the sense amplifier circuit 30 can be turned on.

With the above series of operations, the memory mat 0 is disconnected from the sense amplifier circuit 30 by turning off the selection transistors 13-1 to 13-8 of the memory mat 0 at the selection side for a period of time corresponding to the "word-SE interval" expanded to several µs. Therefore, even when there exists a short circuit defect in the bit line and the word line, there is no data loss due to off-current of the sense amplifier circuit 30. After completion of a test interval, by interconnecting the memory mat 0 at the selection side and the sense amplifier circuit 30, it is possible to detect a short circuit defect site.

Figure 9A:
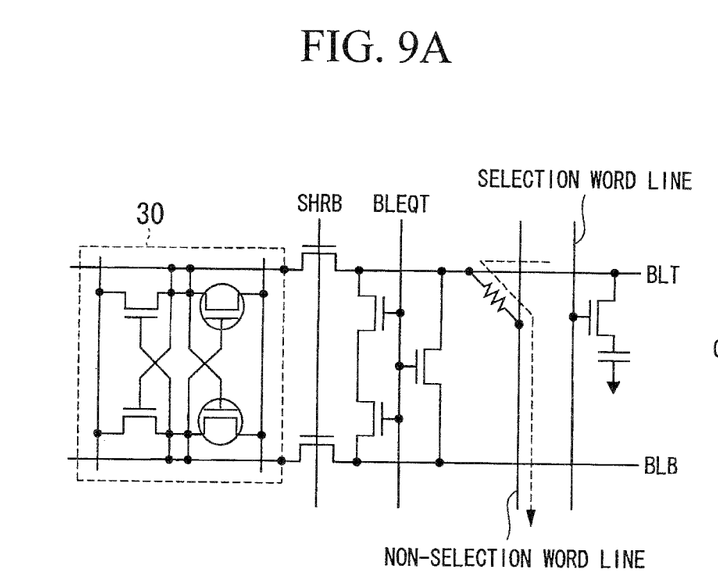
FIG. 9A is a circuit diagram showing a detection state in a short circuit defect site in the word-SE interval expansion test according to the embodiment.
Figure 9B:
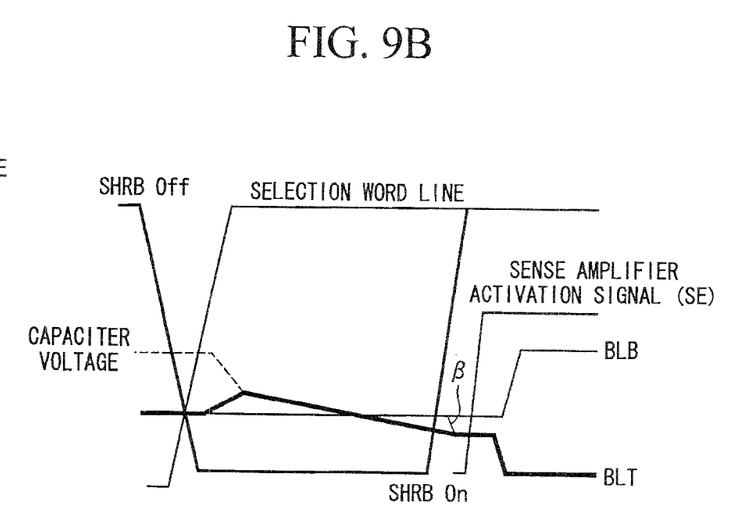
FIG. 9B is a graph showing an operation waveform in the circuit configuration shown in FIG. 9A.

FIGS. 9A and 9B show a detecting operation based on this embodiment when there is a short circuit defect in the bit line BLT and the non-selection word line in the memory mat, as shown in FIGS. 4A and 4B. In this embodiment, during the word-SE interval expansion test, while the control signal SHRB at the selection side is put in an "L" state, the sense amplifier circuit 30 is disconnected from the bit lines 132-1 to 132-8 of the memory mat. Typically, a disconnected bit line is in a floating state. For example, when there is a short circuit between the bit line BLT and the non-selection word line as shown in FIG. 9, defectiveness occurs as the data is drained out of the bit line BLT via the short circuit site. This is an original defect to be detected in the word-SE interval expansion test mode. "β" in FIG. 9B represents potential fall which occurs when the bit lines BLT and BLB are connected to the sense amplifier circuit 30.

Figure 10A:
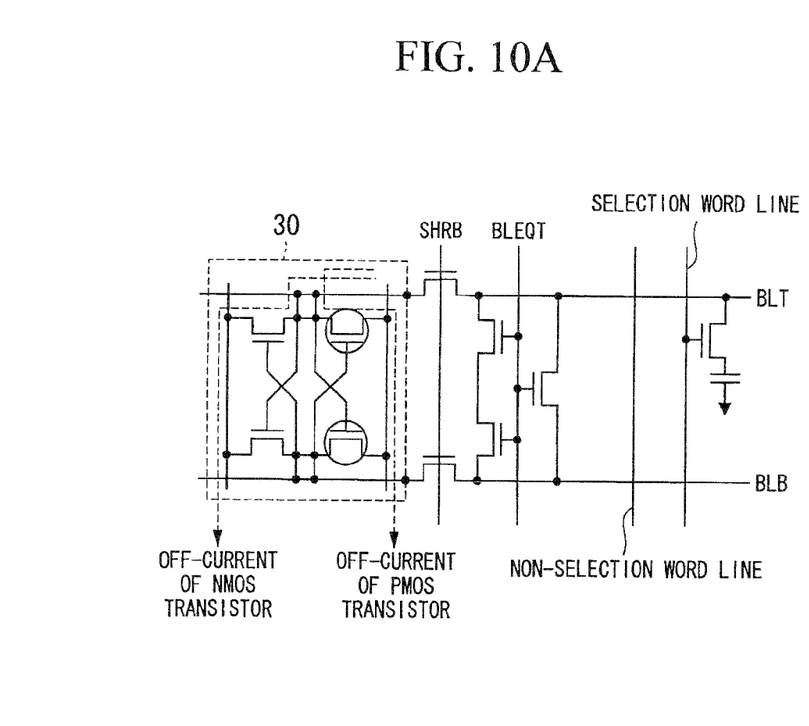
FIG. 10A is a circuit diagram showing a detection state of a normal site in the word-SE interval expansion test according to the embodiment.
Figure 10B:
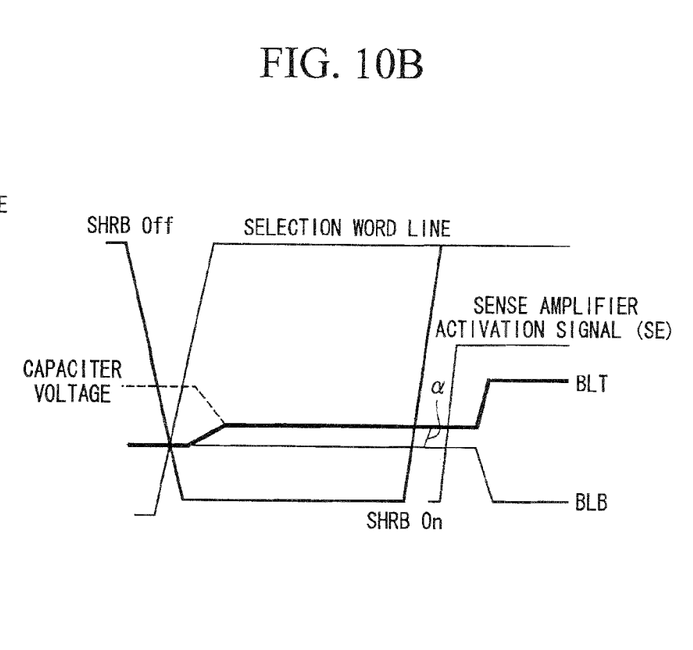
FIG. 10B is a graph showing an operation waveform in the circuit configuration shown in FIG. 10A.

FIGS. 10A and 10B show that read data is not lost by off-current of the sense amplifier circuit 30 by applying this embodiment when the off-current exists in the sense amplifier circuit 30 although there is no short circuit defect in the memory mat.

In a case of no application of this embodiment, that is, in the case of FIGS. 7A and 7B, the control signal SHRB at the selection side remains in the "H" state during the word-SE interval. Since the sense amplifier circuit 30 is connected to the bit lines 132-1 to 132-8 of the memory mat 0, the data on the bit lines is lost due to the off-current of the sense amplifier circuit 30. That is, in the case of FIGS. 7A and 7B, a defect detected in the word-SE interval expansion test mode includes the short circuit defect of the FIGS. 9A and 9B and the defect due to the off-current of the sense amplifier circuit 30. The defect due to the off-current of the sense amplifier circuit 30 is not the cause of a defective operation since the word-SE interval is as short as several ns in the normal operation. For this reason, there is no need to detect the defect due to the off-current in the word-SE interval expansion test mode. With application of this embodiment, by putting the control signal SHRB at the selection side in the "L" state during the word-SE interval, as shown in FIG. 10B, it is possible to maintain and normally amplify a minute potential difference between the bit lines BLT and BLB having no defect occurring due to the off-current of the sense amplifier circuit 30. It is possible to detect only the short circuit defect in the memory mat shown in FIGS. 9A and 9B by erroneous sense. "α" in FIG. 10B represents a potential rise which occurs when the bit lines BLT and BLB are connected to the sense amplifier circuit 30.

With the configuration of the above embodiment, by disconnecting the sense amplifier circuit from the bit lines in the generation interval expansion test of the word line driving sense amplifier circuit activation signal, it is possible to detect the short circuit defect on the bit lines without losing the data on the bit lines due to the off-current of the sense amplifier circuit.

FIG. 1 shows a block diagram of a DRAM of the DDR type. For this reason, although the DRAM is shown to have the DLL circuit 9, the present invention may be applied to a DRAM of types other than the DDR type.

Transistors described in the present invention correspond to the selection transistors 13-1 to 13-16. A test control circuit corresponds to the word-SE interval control circuit 200. Control circuits correspond to the X control circuit 15 and the SA control circuit 14. A clocked inverter corresponds to the clocked inverter 24. A memory device corresponds to the flip-flop circuit 27. A delay element corresponds to the delay element 22. A first logic element corresponds to the AND element 25. Second logic elements correspond to the AND element 29 and the NOR element 23.

According to the present invention, a semiconductor memory device comprises a test control circuit that generates a first control signal based on a word line driving timing signal for driving word lines and a clock signal whose generation interval is randomly expanded, and outputs the generated first control signal during the expanded interval; and a control circuit that is input with a selection signal for selecting a set of pairs of bit lines, generates a switch control signal to switch off a switch portion corresponding to a pair of bit lines selected by the selection signal, based on the first control signal output from the test control circuit and the selection signal, and inputs the generated switch control signal to the switch portion.

With this configuration, in a generation interval expansion test of a word line driving sense amplifier circuit activation signal, it is possible to detect a short circuit defect site on the bit lines without losing data on the bit lines due to off-current of the sense amplifier circuit.

In the semiconductor memory device, the test control circuit comprises a clocked inverter that is input with a signal based on the word line driving timing signal, and disconnects an input and an output by a signal based on the clock signal; a memory element that maintains an output state of the clocked inverter; a first logic element that generates the first control signal based on a test mode initiation signal representing initiation of an input test, the word line driving timing signal, and the output state of the clocked inverter, which is maintained by the memory element, and inputs the generated first control signal to the control circuit; and a second logic element that generates a sense amplifier circuit activation signal based on the output state of the clocked inverter, which is stored in the memory element, and outputs the sense amplifier circuit activation signal to turn off the sense amplifier circuit during the expanded interval.

With this configuration, in the generation interval expansion test of the word line driving sense amplifier circuit activation signal, by disconnecting an input and an output of the clocked inverter during the expanded interval, it is possible to inactivate the sense amplifier circuit by stopping the sense amplifier circuit activation signal generated based on the word line driving timing signal while the switch portion is put in an off state.

In the semiconductor memory device, the first logic element generates a second control signal after the expanded interval, based on the state output from the clocked inverter whose input and output are interconnected by a signal based on the clock signal of a generation interval before being expanded and a state of the word line driving timing signal, and inputs the generated second control signal to the control circuit. The second logic element generates the sense amplifier circuit activation signal based on the output signal of the delay element and the output state of the clocked inverter, which is stored in the memory element, and inputs the sense amplifier circuit activation signal to activate the sense amplifier circuit to the control circuit after lapse of the delay time. The control circuit generates a switch control signal to switch on the switch portion corresponding to a pair of bit lines selected by the selection signal, based on the second control signal output from the first logic element and the selection signal, inputs the generated switch control signal to the switch portion, and inputs the sense amplifier circuit activation signal, which is input from the second logic element, to the sense amplifier circuit.

With this configuration, even in a case where the test is performed, when an expanded period of time of the generation interval of the word line driving sense amplifier circuit activation signal expires, it is possible to activate the sense amplifier circuit in a stable state where the bit lines are connected to the sense amplifier circuit by the switch portion and read data on the bit lines are input to the sense amplifier circuit.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor memory device comprising:
    memory cells which are connected to each of plural pairs of bit lines when one of word lines associated with each of said memory cells is driven;
    sense amplifier circuits that amplify a potential difference between each of said plural pairs of bit lines;
    switch portions which are interposed between each of said memory cells and said sense amplifier circuits on each of said plural pairs of bit lines;
    a test control circuit that generates a first control signal based on a word line driving timing signal for driving said word lines and a clock signal whose clock generation interval is arbitrarily expanded, so as to supply said first control signal during the expanded interval; and
    a control circuit that generates, based on said first control signal, a switch control signal to turn off one of said switch portions corresponding to one of said plural pairs of bit lines selected by a selection signal, and supplies said switch control signal to one of said switch portions.

2. The semiconductor memory device according to claim 1, wherein said test control circuit comprises:
    a clocked inverter that is supplied with a signal based on said word line driving timing signal, and disconnect its input and output in response to said clock signal;
    a memory element that holds an output state of said clocked inverter;
    a first logic element that generates said first control signal based on a test mode initiation signal representing initiation of an input test, said word line driving timing signal, and said output state of said clocked inverter, to supply said first control signal to said control circuit; and
    a second logic element that generates a sense amplifier circuit activation signal based on said output state of said clocked inverter, to turn off one of said sense amplifier circuits during said expanded interval.

3. The semiconductor memory device according to claim 2, wherein:
    said second logic element further comprises a delay element that delays a signal based on said output state of said clocked inverter for a predetermined period of delay time after said expanded interval has elapsed;
    said first logic element generates a second control signal after said expanded interval has elapsed, based on a state output from said clocked inverter whose input and output are interconnected by a signal based on said clock signal of a generation interval before being expanded and a state of said word line driving timing signal, and supplies said second control signal to said control circuit;
    said second logic element generates said sense amplifier circuit activation signal based on an output signal of said delay element and said output state of said clocked inverter, and supplies said sense amplifier circuit activation signal to activate said sense amplifier circuit to said control circuit after said delay time has elapsed; and
    said control circuit generates said switch control signal, based on said second control signal and said selection signal.

* * * * *